United States Patent [19]

März

[11] Patent Number: 5,923,706
[45] Date of Patent: Jul. 13, 1999

[54] PROCESS FOR MEASURING PHASE JITTER OF A DATA SIGNAL

[75] Inventor: Freimut März, Oberschleissheim, Germany

[73] Assignee: Tektronix, Inc., Wilsonville, Oreg.

[21] Appl. No.: 08/776,467

[22] PCT Filed: Jul. 18, 1995

[86] PCT No.: PCT/DE95/00977

§ 371 Date: May 29, 1997

§ 102(e) Date: May 29, 1997

[87] PCT Pub. No.: WO96/03659

PCT Pub. Date: Feb. 8, 1996

[30]  Foreign Application Priority Data

Jul. 21, 1994 [DE] Germany .............................. 44 26 713

[51] Int. Cl.$^6$ .................................................. H04B 3/46
[52] U.S. Cl. .......................... 375/226; 375/226; 375/371
[58] Field of Search ................................... 375/226, 371; 327/100, 156, 3; 324/76.77, 76.39; 364/481

[56]  References Cited

U.S. PATENT DOCUMENTS

| | | | |
|---|---|---|---|
| 3,671,776 | 6/1972 | Houston | 327/155 |
| 4,819,080 | 4/1989 | Cucchietti et al. | 324/76.77 |
| 4,974,234 | 11/1990 | Brandt | 375/226 |

FOREIGN PATENT DOCUMENTS

| | | | |
|---|---|---|---|
| 2199470 | 6/1988 | United Kingdom | 375/226 |

*Primary Examiner*—Stephen Chin
*Assistant Examiner*—Shuwang Liu
*Attorney, Agent, or Firm*—Richard L. Mayer; Thomas F. Lenihan

[57]  ABSTRACT

A process for measuring the phase jitter of a data signal using a phase demodulator. To perform an accurate and relatively simple measurement of phase jitter, the data signal is supplied to a phase comparator and an auxiliary clock signal derived from a predetermined clock signal is supplied to the phase comparator via a gate circuit and a frequency divider. If the phase difference between the two signals exceeds a predetermined value, a control circuit controls the gate circuit so that the phase of the auxiliary clock signal is modified until the phase difference drops below the predetermined value. The modified auxiliary clock signal is modified again, generating a comparison clock signal which is provided to a phase modulator having an integrator so that the edge of the corresponding pulse of the data signal falls in the middle of the ramp-like output signal of the integrator when the phase jitter is zero.

9 Claims, 3 Drawing Sheets

PROCESS FOR MEASURING PHASE JITTER OF A DATA SIGNAL

FIELD OF THE INVENTION

The present invention relates to a process for measuring the phase jitter of a data signal by means of a phase demodulator using a predetermined clock signal.

BACKGROUND INFORMATION

A process for measuring the phase jitter of a data signal is described in the IEE publication "International Conference on Measurements for Telecommunication Transmission Systems—MTTS" vol. 85 (1985) pages 173 and 174. In this known process, a predetermined clock signal is used as a reference signal which is compared with a data signal with regard to phase relation to determine the phase jitter of the data signal. Problems occur with this known process due to static phase shifts that cause a reduction in dynamic range. In addition, high-frequency components occur with regard to the baseband of the resulting jitter signal, thereby requiring a low-pass filter to eliminate the high-frequency components.

As described in the aforementioned publication, amplitude-modulated pulses can be obtained within the scope of the phase jitter measurement by sampling a ramp-like signal coupled to the clock signal when a data signal occurs. This known process apparently does not use a phase comparator connected to a predetermined clock signal via a frequency divider and a gate circuit controlled by a control circuit.

Furthermore, German Patent No. 38 33 486 C1 describes a process and a circuit arrangement for measuring the phase jitter of a data signal in which a ramp-like signal-generating integrator with a downstream sample-and-hold circuit is used. In this known process, the integrator is released to generate the ramp-like signal when an upstream release circuit supplies an output signal. This output signal is generated as a function of the occurrence of a clock signal and the starting status of a digital comparator which is downstream from an arrangement with two detent memories and a detent counter that receives the clock signal. The detent memories receive pulses derived from the data signals in parallel. The output of the digital comparator is connected to an address generator with a downstream intermediate memory and a downstream digital-to-analog converter. An approximate phase jitter value appears at the output of the digital-to-analog converter. A precision phase jitter value is obtained at the output of the sample-and-hold circuit. A measured quantity representing the phase jitter is generated from these two values by means of a summation circuit.

SUMMARY OF THE INVENTION

An object of the present invention is to provide an improved process for measuring phase jitter which yields accurate measurement results with comparatively little expense.

In a process for measuring the phase jitter of a data signal using a predetermined clock signal by means of a phase modulator, the aforementioned object is achieved by deriving an auxiliary clock signal from a predetermined clock signal with the help of a gate circuit, where the frequency of the auxiliary clock signal corresponds to the frequency of the data signal. The phase difference between the data signal and the auxiliary clock signal is determined, and when the phase deviation found between the data signal and the auxiliary clock signal exceeds a predetermined phase deviation, the gate circuit is actuated, generating a modified clock signal, such that the phase deviation drops below the predetermined deviation. A comparison clock signal is then formed from the modified auxiliary clock signal so that the comparison clock signal has a phase relation to the modified clock signal such that with a phase demodulator receiving at its input the comparison clock signal and the data signal and having a ramp-like signal-generating integrator and a downstream sample-and-hold circuit, an edge of the corresponding pulse of the data signal falls in the middle of the ramp-like signal when the phase jitter is zero. The data signal and the comparison clock signal are then sent to the phase demodulator to measure the phase jitter, where the integrator is actuated by the comparison clock signal and the sample-and-hold circuit is actuated by the data signal.

An important advantage of the process according to the present invention is that the predetermined clock signal is brought to a defined phase relation to the data signal by the phase comparator and the gate circuit with the downstream frequency divider. To do so, in a process according to the present invention, the modified clock signal is obtained in an advantageous manner by suppressing pulses of the predetermined clock signal by appropriate actuation of the gate circuit by the control device until the phase deviation between the data signal and the revised auxiliary clock signal has dropped below the predetermined deviation. This method of generating the auxiliary clock signal is especially simple to implement.

A similar method is followed to generate the clock comparison signal because of the ease of implementation, namely by extracting the clock comparison signal by suppressing a number of pulses of the clock signal by having the control device actuate the gate circuit so that the clock comparison signal is shifted in comparison with the modified auxiliary clock signal by a period of time corresponding to half the rise time of the ramp-like output signal of the integrator.

The process according to the present invention can be used advantageously to measure the phase jitter of ISDN (integrated services digital network) data signals of multi-stage codes when data signals running over the full signal deviation defined by the respective code are detected as the relevant data signals in an analysis circuit and corresponding analysis signals are supplied as data signals to the phase comparator and the phase modulator. The integrator is started by a control unit that is downstream from the analysis circuit and is contained in the phase demodulator by means of the auxiliary clock signal, and the sample-and-hold circuit downstream from the integrator is actuated to sample. Triggered by a relevant data signal, the sample-and-hold circuit is switched by the control unit to the holding function and an additional downstream sample-and-hold circuit is switched to the holding function to receive the retained sample before the first sample-and-hold circuit is triggered to sample again in a repeat start of the integrator. The sample thus transferred at the output of the additional sample-and-hold circuit is picked off as the measured phase jitter value.

An important advantage of this embodiment of the process according to the present invention is that the phase jitter can be determined unambiguously even with ISDN data signals of multi-stage codes because it detects only relevant data signals. The relevant data signals run through the full signal deviation defined by the respective code, whereas all other data signals are disregarded in the phase jitter measurement. The latter is in turn possible without any significant measurement error only because a control unit that controls an integrator with two downstream sample-and-hold circuits in response to a predetermined clock signal is provided in an advantageous manner in the process according to the present invention. The two sample-and-hold circuits assure that when irrelevant data signals occur, the last detected sample of the integrator is retained so that the last measured value is held at the output of the additional sample-and-hold circuit. The measurement error thus generated, however, is insignificant due to the high frequency of the data signals. As such, the phase jitter measurement process according to the present invention is characterized by a relatively high measurement accuracy despite the presence of ISDN data signals of multi-stage codes.

In a circuit arrangement for carrying out the process of the present invention, the analysis circuit may be designed in various ways as long as it assures that the relevant data signals are detected reliably. However, it is advantageous if, according to another embodiment of the present invention, the analysis circuit has at its input three comparators receiving the data signals in parallel, where the first comparator is set at a predetermined lower data signal threshold that is below a threshold of zero, the second comparator is set at a threshold of zero, and the third comparator is set at a predetermined upper data signal threshold that is above the zero threshold. Downstream from the first comparator is a first timer, and downstream from the second comparator is a second timer, where the period of time set on the first timer is shorter than the duration of a data signal, and the period of time set on the second timer is shorter than the period of time set on the first timer but longer than the maximum expected rise time of a data signal. Downstream of the two timers and the third comparator is a common AND element for obtaining a tripping signal, and downstream from the common AND element is an additional timer that supplies an analysis data signal corresponding to the relevant data signal at its output when the tripping signal decays. The leading edges of relevant data signals can be detected with such an analysis circuit for a phase jitter measurement.

To be able to test relevant data signals with regard to their trailing edges, the analysis circuit is provided at its input with three comparators receiving data signals in parallel, where the first comparator is set at a predetermined lower threshold of the data signals, the second comparator is set at a threshold of zero and the third comparator is set at a predetermined upper threshold. Downstream from the third comparator is a third timer, and downstream from the second comparator is a timing circuit, where the period of time set on the third timer is shorter than the duration of a data signal, and the period of time set on the timing circuit is shorter than the period of time set on the third timer but longer than the maximum expected decay time of a data signal. Downstream from the third timer and the timing circuit as well as the third comparator is a common AND circuit for generating a tripping pulse, and downstream from the common AND circuit is an additional timer that supplies an analysis data signal corresponding to the respective relevant data signal at its output when the tripping signal decays.

Frequently it is necessary to be able to test the relevant data signals together with regard to their leading and trailing edges. This requirement is met by an advantageous embodiment of the circuit arrangement according to the present invention. Starting from the circuit arrangement for analyzing leading edges of signals, a third timer is connected to the output of the third comparator, and additionally a timing circuit is connected to the output of the second comparator, where the period of time set on the third timer is shorter than the duration of a data signal, and the period of time set on the timing circuit is shorter than the period of time on the third timer but longer than the maximum expected decay time of a data signal. Downstream from the third timer and the timing circuit as well as the first comparator is a second common AND circuit for generating a tripping pulse, and downstream from the second common AND circuit is the additional timer that supplies at its output an analysis signal corresponding to the respective relevant data signal when the tripping pulse supplied by the second common AND circuit decays.

DETAILED DESCRIPTION

Figure 1:
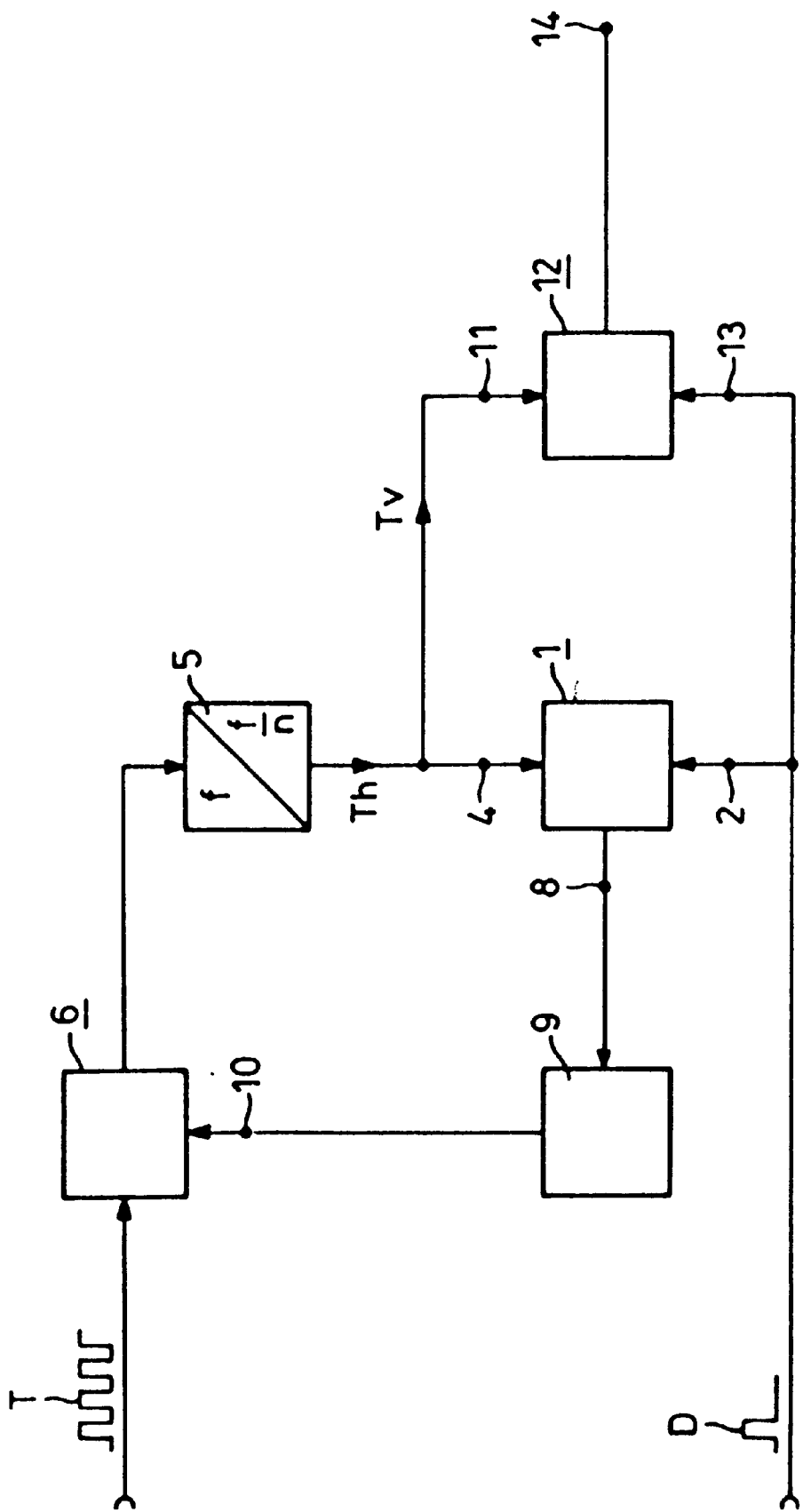
FIG. 1 shows a block diagram of an arrangement for carrying out a process according to the present invention.

FIG. 1 shows a block diagram of a system for carrying out a process for measuring phase jitter in accordance with the present invention. The arrangement of FIG. 1 contains, among other things, a phase comparator 1 that receives at one input 2 a data signal D, which may be a signal B or B' derived from a data signal of an ISDN system (see FIG. 3). Another input 4 of the phase comparator 1 is coupled, via a frequency divider 5, to a gate circuit 6 that receives at its input a predetermined clock signal T, which may be, for example, a system clock retrieved from the data signal. A controlling element 9 is connected to an output 8 of the phase comparator 1. An output of the controlling element 9 is connected to a control input 10 of the gate circuit 6.

As FIG. 1 also shows, an input 11 of a phase demodulator 12 is connected to the output of the frequency divider 5. A second input 13 of the phase demodulator 12 receives the data signal D or the signal B or B' derived from it. An output 14 of the phase demodulator 12 supplies a signal that is a measure of the phase jitter between the data signal D (or the signal B or B') and the predetermined clock signal T.

The operation of the circuit arrangement illustrated in FIG. 1 for carrying out the process according to the present invention will now be described. The frequency divider 5 is set with regard to the relatively high frequency of the predetermined clock signal T so that it delivers at its output an auxiliary clock signal Th corresponding in frequency to the frequency of the data signal D. In the phase comparator 1, the auxiliary clock signal Th is compared with the data signal D. At the output 8, a signal indicative of the difference in phase between the auxiliary clock signal Th and the data signal D is delivered to the controlling element 9. For this purpose, the phase comparator 1 may be designed as an edge-triggered D-flip-flop (see, for example, H. Germaer, N. Wefers, "Measurement Electronics," volume 2 (1990) pages 34 and 35). If the phase comparator 1 detects a phase difference, the gate circuit 6 is actuated by the microprocessor-equipped controlling element 9 via the control input 10 so that one or more pulses of the predetermined clock signal T are suppressed. In this way, the phase relation of the auxiliary clock signal Th is modified in comparison with that of the data signal D. If the phase angles of the auxiliary clock signal Th and the data signal D have approached each other in this way to the extent that the phase deviation between the two signals is less than the phase deviation predetermined by the controlling element 9, then a comparison clock signal Tv that has been subjected to a defined phase shift by the controlling element 9 is generated (starting from the auxiliary clock signal Th) for the phase demodulator 12 equipped with an integrator (not shown in FIG. 1) such that the leading edge of the data signal D falls in the middle of the ramp-like output signal of the integrator of the phase demodulator 12, as explained in detail below. As a result, the largest possible phase angle deviation is utilized in demodulation of the phase angle.

Figure 2:
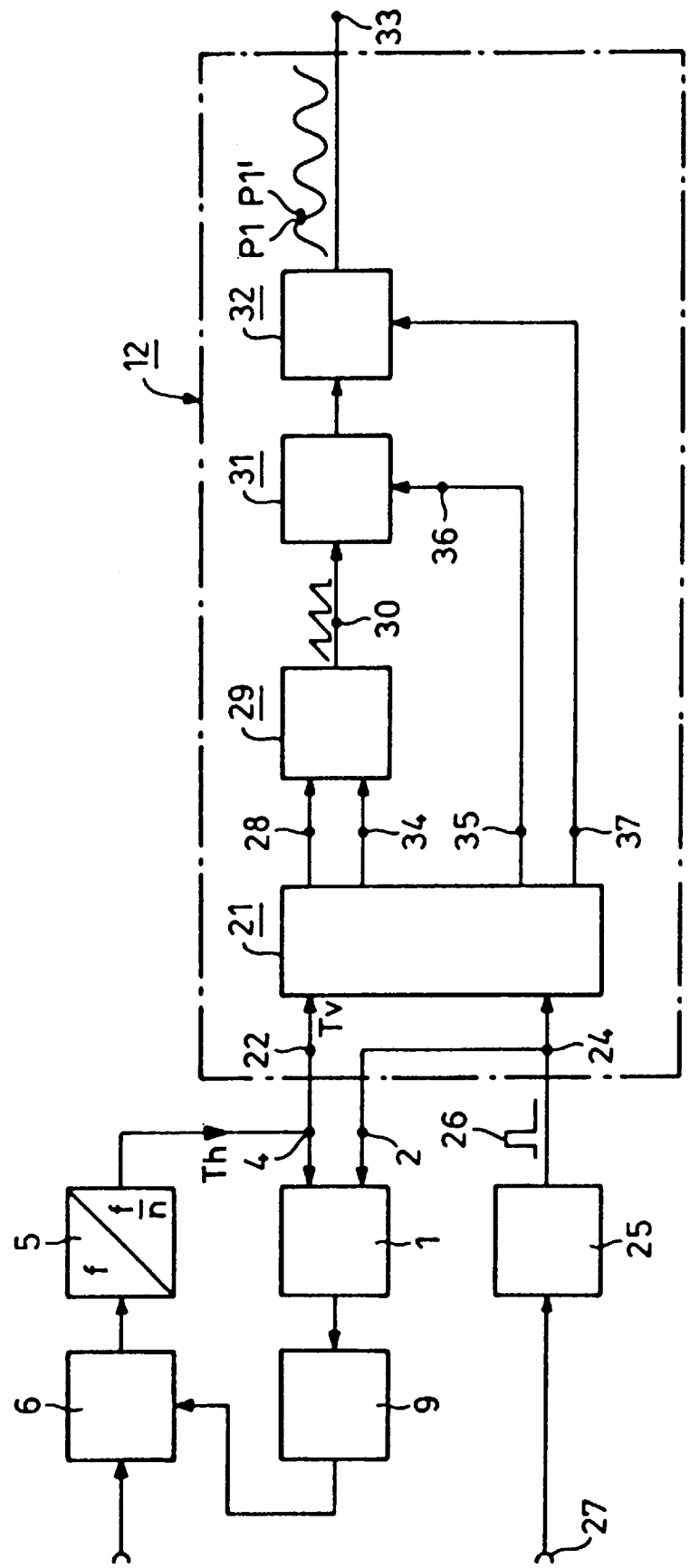
FIG. 2 shows a detailed embodiment of the circuit arrangement according to FIG. 1 with a phase demodulator having an integrator.

FIG. 2, in which the elements corresponding to those in FIG. 1 are labeled with the same notation, shows that the phase demodulator 12 has a control unit 21 that receives the comparison clock signal Tv at an input 22. Modules 1, 9, 6 and 5 are connected to the input 22, as shown in FIG. 1. Via analysis circuit 25, another input 24 of the control unit 21 receives analysis data signals 26 formed from ISDN data signals applied at one input 27 of the analysis circuit 25. The other input 24 is also connected to an input of the phase comparator 1.

Triggered by the comparison clock signal Tv, the control unit 21, via output 28, starts an integrator 29 that delivers a sawtooth ramp output voltage at output 30. Downstream from the integrator 29 is a sample-and-hold circuit 31 which has another sample-and-hold circuit 32 downstream from it. Output 33 of the sample-and-hold circuit 32 forms the output of the entire circuit arrangement. Control unit 21 can reset integrator 29 via another output 34.

As FIG. 2 shows, the control unit 21 is connected at an additional output 35 to a control input 36 of the first sample-and-hold circuit 31. The sample-and-hold circuit 31, which is triggered via the input 36 to start sampling with the start of integrator 29, is switched when the control unit 21 receives an analysis data signal 26 from the analysis circuit 25. The analysis data signal is a signal formed by the analysis circuit 25 from the incoming data signals of a multi-stage code when a relevant data signal occurs, namely a data signal running over the full signal deviation, e.g., from −3 to +3, which is the case with multi-stage code 2B1Q, for example. The sample held by the sample-and-hold circuit 31 is retained by the additional sample-and-hold circuit 32 by means of a signal supplied via a fourth output 37 of the control unit 21. The value thus retained forms a measured point (e.g., P1) on the signal at output 33.

If the output signal of the integrator 29 has passed through a sawtooth, then the control unit 21 causes the integrator 29 and the sample-and-hold circuit 31 to be reset and restarted, and the same process as just described takes place again if another analysis data signal follows the first analysis data signal. If this is not the case, in other words, an analysis data signal does not appear at the input 24 of the control unit 21, then the first sample-and-hold circuit 31 does not acquire a new sample and the additional sample-and-hold circuit 32 is not switched to sampling to receive the signal from the first sample-and-hold circuit 31. Then the sample-and-hold circuit of the preceding cycle retained by the additional sample-and-hold circuit 32 is still retained and at the output 33 a sample P1' is generated, corresponding to the value P1. The sample P1' is slightly offset in time relative to the sample P1 because the sample P1' originates from a later cycle.

If in a following measurement cycle, analysis data signal 26 in turn appears at input 24 of the control unit 21, then the additional sample-and-hold circuit 32 is switched by the control unit 21 to start sampling via the additional output 37, so now it is ready to receive a new sample from the first sample-and-hold circuit 31 connected upstream.

Figure 3:
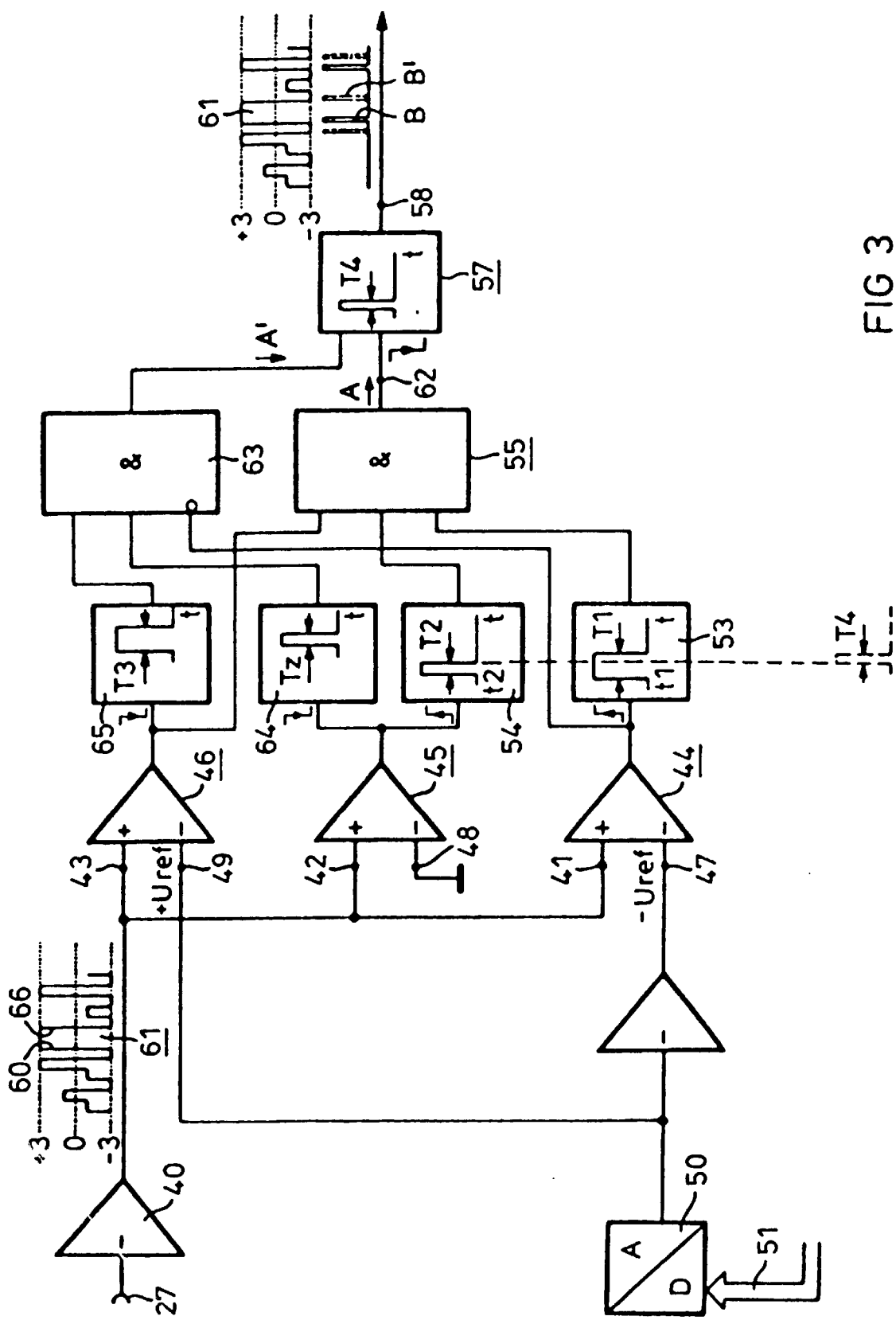
FIG. 3 shows an embodiment of the analysis circuit illustrated in FIG. 2.

FIG. 3 shows an embodiment of the analysis circuit 25 shown in FIG. 2. FIG. 3 shows that data signals of an ISDN system in quaternary code are connected in parallel to noninverting inputs 41, 42 and 43 of a first comparator 44, a second comparator 45 and a third comparator 46, respectively, via input 27 and an input amplifier 40. With respect to their inverting inputs 47, 48 and 49, comparators 44 to 46, preferably designed as differential amplifiers, are at different reference voltages, supplied by digital-to-analog converter 50, which is in turn connected at its input to a computer bus 51. In this way, the comparator 44 can be set at a lower threshold of approximately −3, the second comparator 45 at a threshold of zero and the third comparator 46 at an upper threshold of approximately +3.

FIG. 3 also shows a first timer 53 arranged downstream from the first comparator 44 and a second timer 54 arranged downstream from the second comparator 45. Both the timers 53 and 54 are connected at the outputs to an AND element 55 which is also connected directly to the third comparator 46. At the output, the AND element 55 is connected to an additional timer 57 whose output 58 is connected to the additional input 24 of the control unit 21 (see FIG. 2).

The operation of the analysis circuit illustrated in FIG. 3 will now be described. If a leading edge 60 of a relevant data signal 61 is to be detected for a phase jitter measurement, then at time t1 the first timer 53 is started by the leading edge 60. The period of time T1 set on the first timer 53 is slightly shorter than the duration of the relevant data signal 61. At a later time t2, the second timer 54 is started at the zero crossing of the edge 60. The timer 54 is set to a time T2 which is shorter than the time T1 of the first timer 53 but longer than the maximum expected rise time of the relevant data signal 61. When the relevant data signal 61 reaches the upper threshold +3, both timers 53 and 54 and the third comparator 46 act on AND element 55 jointly within a short interval. FIG. 3 shows that a tripping signal A subsequently appearing at output 62 of the AND element 55 also decays with the fall of the second timer 54. The tripping signal A starts an additional timer 57. This leads to analysis data signal B, plotted with solid-line curves at output 58 of the additional timer 57 and corresponding to the leading edge of the relevant data signal 61. In addition, the curves for the input data signals are also shown for illustration purposes.

FIG. 3 also shows that the first comparator 44 is connected directly to an inverting input of an AND circuit 63. Another input of the AND circuit 63 is connected to the output of the second comparator 45 via a timing circuit 64, and an additional input of the AND circuit 63 is connected to the output of the third comparator 46 via a third timer 65. When the relevant data signal 61 or its trailing edge 66 decays, a tripping pulse A' is generated at the output of the AND circuit 63, in response to which another analysis data signal B', shown with a dotted line at output 58 of additional timer 57, is generated by the additional timer 57.

I claim:

1. A process for measuring phase jitter of a data signal with a phase demodulator using a predetermined clock signal, comprising the steps of:

deriving an auxiliary clock signal, whose frequency corresponds to a frequency of the data signal, from the predetermined clock signal using frequency division;

determining a phase difference between the data signal and the auxiliary clock signal;

generating a modified auxiliary clock signal when the phase difference exceeds a predetermined phase deviation so that the phase difference drops below the predetermined phase deviation;

generating a comparison clock signal from the modified auxiliary clock signal, wherein the comparison clock signal and the modified auxiliary clock signal have a phase relation such that when the phase demodulator receives the comparison clock signal and the data signal, an edge of a corresponding pulse of the data signal falls in the middle of a ramp-like signal when the phase jitter is zero;

supplying the data signal and the comparison clock signal to the phase demodulator to generate a signal indicative of the phase jitter;

actuating an integrator with the comparison clock signal to generate the ramp-like signal; and actuating a sample-and-hold circuit with the data signal, the sample-and-hold circuit being located downstream of the integrator.

2. The process of claim 1, wherein the modified auxiliary clock signal is generated by suppressing a number of pulses of the predetermined clock signal by appropriate triggering of a gate circuit by a controlling element so that the phase deviation between the data signal and the modified auxiliary clock signal drops below the predetermined deviation.

3. The process of claim 1, wherein the comparison clock signal is generated by suppressing a number of pulses of the predetermined clock signal by actuating a gate circuit with a controlling element so that the comparison clock signal is shifted in comparison with the modified auxiliary clock signal by a period of time corresponding to half a rise time of the ramp-like signal.

4. The process of claim 1, wherein:

the phase jitter of ISDN data signals of multi-stage codes is measured, wherein the data signals that run over a complete signal deviation defined by a respective code are detected as relevant data signals and corresponding analysis data signals are supplied as to the phase comparator and the phase demodulator, the integrator is actuated by the comparison clock signal, the sample-and-hold circuit downstream from the integrator is triggered by a relevant data signal;

the sample-and-hold circuit is switched to the holding function, and a downstream additional sample-and-hold circuit is switched to the holding function to receive the sample thus retained before the sample-and-hold circuit is triggered to start sampling again in a repeat start of the integrator, and the sample thus transferred is picked off at an output of the additional sample-and-hold circuit as the measured phase jitter value.

5. A circuit for measuring the phase jitter of a data signal by means of a phase demodulator using a predetermined clock signal, the circuit comprising:

a gate circuit with an input for receiving the predetermined clock signal;

a frequency divider coupled to an output of the gate circuit, the frequency divider generating an auxiliary clock signal having a frequency corresponding to a frequency of the data signal;

a phase comparator with a first input for receiving the data signal and a second input for receiving the auxiliary clock signal;

a controlling element with an input coupled to an output of the phase comparator and an output coupled to the gate circuit, wherein when a phase deviation between the data signal and the auxiliary clock signal exceeds a predetermined phase deviation, the controlling element controls the gate circuit to generate a modified auxiliary clock signal so that the phase deviation drops below the predetermined phase deviation;

a phase demodulator including:
an integrator that is controlled by a comparison clock signal, and
a sample-and-hold circuit coupled to an output of the integrator and being controlled by the data signal;

wherein the comparison clock signal is generated from the modified auxiliary clock signal by controlling the gate circuit with the controlling element so that an edge of a corresponding data signal falls in the middle of a ramp-like signal generated by the integrator when the phase jitter is zero, and wherein a signal indicative of the phase jitter is generated by the sample-and-hold circuit.

6. The circuit of claim 5, comprising an analysis circuit for detecting relevant data signals in ISDN data signals of multi-stage codes, the relevant data signals being data signals which run over a full signal deviation defined by a respective code, wherein, an output of the analysis circuit is connected to an input of the phase comparator and to an input of a control unit that is provided in the phase demodulator, the control unit starts the integrator and the sample-and-hold circuit is triggered to sample in response to the comparison clock signal, the sample-and-hold circuit is switched to a holding function in response to a relevant data signal and an additional sample-and-hold circuit coupled to an output of the sample-and-hold circuit is switched to the holding function to receive the sample thus retained before the sample-and-hold circuit is triggered to sample again with a repeat start of the integrator, and the measured phase jitter value appears at an output of the additional sample-and-hold circuit.

7. The circuit of claim 6, wherein the analysis circuit includes:

first, second and third comparators receiving data signals in parallel, wherein the first comparator is set at a predetermined lower threshold of the data signals which is below a threshold of zero, the second comparator is set at the threshold of zero, and the third comparator is set at a predetermined upper threshold which is above the threshold of zero;

a first timer coupled to an output of the first comparator, the first timer being set to a first period of time which is shorter than a duration of the data signal;

a second timer coupled to an output of the second comparator, the second timer being set to a second period of time which is shorter than the first period of time and longer than a maximum expected rise time of the data signal;

a first logic element coupled to outputs of the first and second timers and of the third comparator, the first logic element generating a first tripping pulse; and a third timer coupled to an output of the first logic element, the third timer generating an analysis data signal corresponding to the relevant data signal when the first tripping pulse decays.

8. The circuit of claim 6, wherein the analysis circuit includes:

first, second and third comparators receiving data signals in parallel, wherein the first comparator is set at a predetermined lower threshold of the data signals which is below a threshold of zero, the second comparator is set at the threshold of zero, and the third comparator is set at a predetermined upper threshold which is above the threshold of zero;

a first timer coupled to an output of the third comparator, the first timer being set to a first time period which is shorter than a duration of the data signal;

a timing circuit coupled to an output of the second comparator, the timing circuit being set to a time period which is shorter than the first time period and longer than a maximum expected decay time of the data signal;

a logic element coupled to outputs of the fourth timer, the timing circuit and the first comparator, the logic element generating a tripping pulse; and a second timer coupled to an output of the logic element, the second timer generating an analysis data signal corresponding to the relevant data signal when the tripping pulse decays.

9. The circuit of claim 7, wherein the analysis circuit includes:

a fourth timer connected to the output of the third comparator, the fourth timer being set to a third time period which is shorter than a duration of the data signal;

a timing circuit connected to an output of the second comparator, the timing circuit being set to a time period which is shorter than the third time period and longer than a maximum expected decay time of a data signal; and a second logic element coupled to outputs of the fourth timer, the timing circuit and the first comparator, the second logic element generating a second tripping pulse, wherein the third timer is coupled to an output of the second logic element, the third timer generating an analysis data signal corresponding to the relevant data signal when the second tripping pulse decays.

* * * * *